United States Patent [19]

Lehrer et al.

[11] Patent Number: 4,704,342
[45] Date of Patent: Nov. 3, 1987

[54] PHOTOMASK HAVING A PATTERNED CARBON LIGHT-BLOCKING COATING

[75] Inventors: William I. Lehrer, Los Altos; P. Anthony Crossley, Palo Alto, both of Calif.

[73] Assignee: Fairchild Semiconductor Corporation, Cupertino, Calif.

[21] Appl. No.: 719,020

[22] Filed: Apr. 2, 1985

[51] Int. Cl.[4] ................................................ G03F 9/00
[52] U.S. Cl. ........................................ 430/5; 430/321; 430/323; 430/945; 427/228; 427/240; 427/140; 427/53.1
[58] Field of Search .................. 430/5, 321, 945, 323; 427/140, 53.1, 228, 240

[56] References Cited

U.S. PATENT DOCUMENTS

| | | |
|---|---|---|
| 935,180 | 9/1909 | Williamson . |
| 1,158,965 | 11/1915 | Beatty . |
| 2,016,139 | 10/1935 | Eddison . |
| 3,027,278 | 3/1962 | Reick . |
| 3,628,984 | 12/1971 | Ishikawa et al. . |
| 3,650,796 | 3/1972 | Jackson et al. ............... 430/945 X |
| 3,775,078 | 11/1973 | Elmer et al. . |
| 3,791,847 | 2/1974 | Araki et al. . |
| 3,854,979 | 12/1974 | Rossi . |
| 3,930,822 | 1/1976 | Elmer . |
| 3,940,509 | 2/1976 | Youtsey et al. . |
| 4,068,018 | 1/1978 | Hashimoto et al. ................. 427/38 |
| 4,210,431 | 7/1980 | Bachman et al. . |
| 4,253,888 | 3/1981 | Kikuchi .............. 148/187 |
| 4,393,101 | 7/1983 | Bilow . |
| 4,414,059 | 11/1983 | Blum et al. .................. 156/659.1 |

FOREIGN PATENT DOCUMENTS 53-120273 10/1978 Japan ..................................... 430/5

OTHER PUBLICATIONS

Inspektor et al., "Characterization . . . Argon", *Thin Solid Films,* 72 (1980), 195–200.
Lyons et al., "Thin Pinhole-Free Carbon Films", *Thin Solid Films,* 103 (1983), 333–34.

Primary Examiner—John E. Kittle
Assistant Examiner—José G. Dees
Attorney, Agent, or Firm—Stephen J. Phillips; David H. Carroll; James A. LaBarre

[57] ABSTRACT

A photomask for use in manufacturing integrated circuits is fabricated by coating a thin film of organic material, generally a solution of a thermally decomposable hydrocarbon, onto a glass plate and heating it in a reducing atmosphere to convert it into carbon. The carbon layer is masked and etched; for example, in an oxygen plasma, to produce the mask.

13 Claims, 3 Drawing Figures

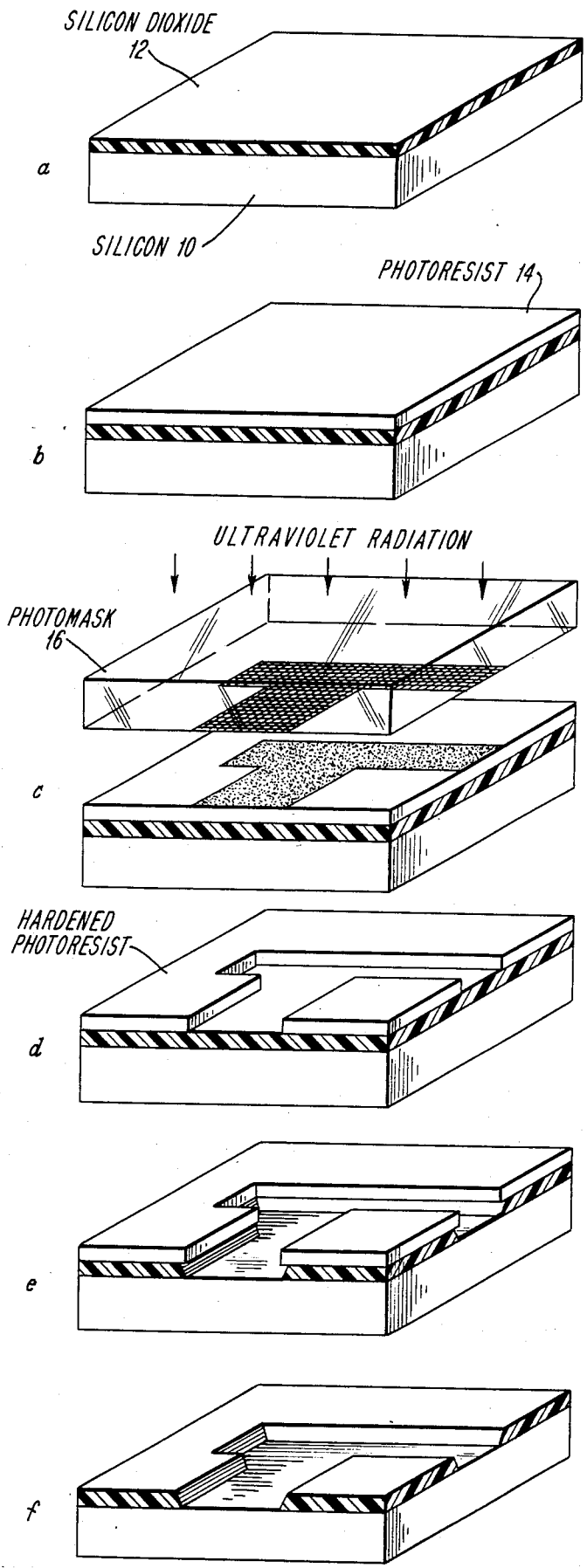

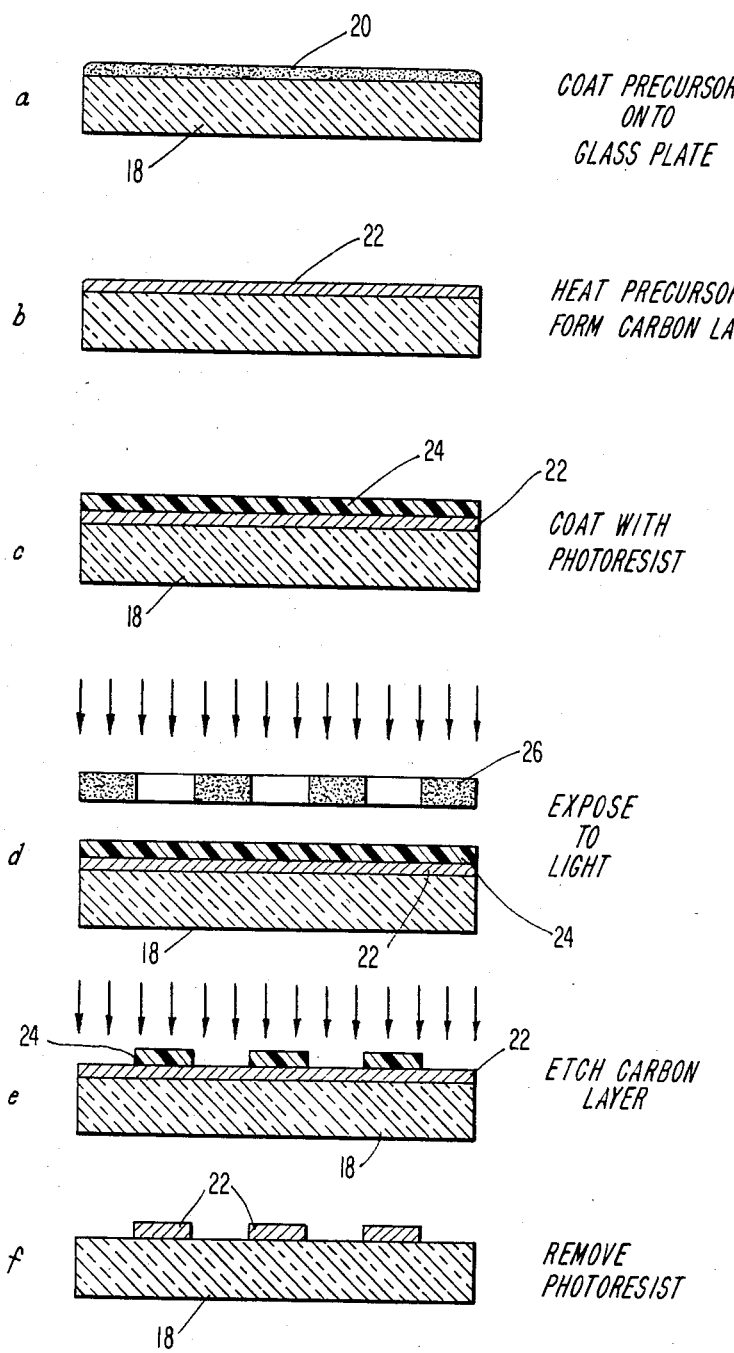
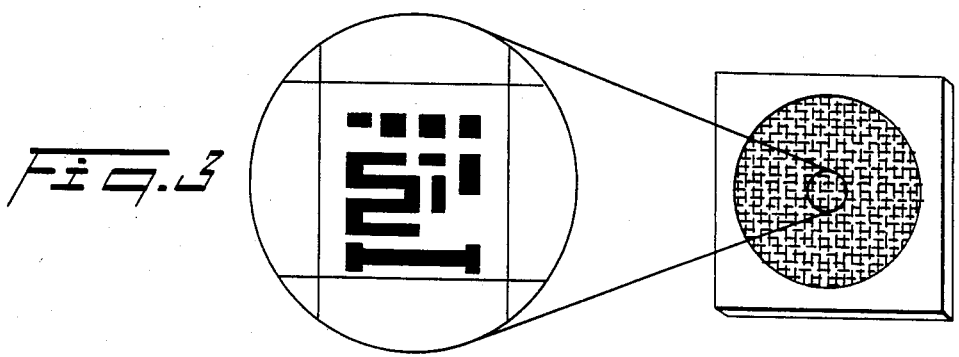

PHOTOMASK HAVING A PATTERNED CARBON LIGHT-BLOCKING COATING

BACKGROUND OF THE INVENTION

The present invention is generally directed to the manufacture of integrated circuits, and more particularly is concerned with the fabrication of photomasks that are employed during such manufacture.

In the manufacture of integrated circuits, the selective diffusion of impurities into the layers of a silicon wafer, as well as the selective removal of portions of various layers, are controlled by means of a photolithographic process. For example, as shown in FIG. 1, when an impurity is to be diffused into predefined areas of a silicon substrate 10 to form components of a device such as a transistor, the substrate is first covered with a thin layer 12 of silicon dioxide (step a). The silicon dioxide is then coated with a photoresist material 14 (step b) which is selectively exposed to ultraviolet light through a patterned photomask 16 (step c). The pattern on the photomask relates to the predefined areas of the silicon into which the impurity is to be diffused.

By nature of the selective exposure to the ultraviolet light, certain portions of the photoresist layer become polymerized while other portions remain unpolymerized. The unpolymerized portions can be washed away in a suitable developing solution, to expose some of the area of the underlying silicon dioxide layer (step d). The wafer is then subjected to an etching solution which removes the exposed portions of the silicon dioxide layer down to the silicon (step e). The photoresist is removed and a silicon dioxide mask remains on the surface of the silicon (step f). The impurity is then diffused into the exposed portions of the silicon and the silicon dioxide mask can subsequently be removed in preparation for the following steps in the fabrication of the circuit.

The present invention is particularly concerned with the photomask 16 that is used to selectively expose the photoresist material on the silicon dioxide layer. In the past, photomasks have generally comprised glass plates that are covered with a photosensitive emulsion. However, the emulsion layer by itself is susceptible to scratches and tears. It will be appreciated that a scratch in an emulsion layer will enable light to pass through the photomask in an area where light should be blocked, and thus could result in an impurity being diffused into the silicon in such a manner that the resulting circuit would be defective. Accordingly, in order to provide greater durability to the photomask, a thin film of chromium has been substituted for the photosensitive emulsion. Basically, a photomask "blank" is first produced by sputtering chromium onto a glass plate. The blank is then covered with a photosensitive emulsion which is exposed to the desired pattern, and etched in a wet chemical process to remove the chromium in the areas in which it is desirable to let light pass through the mask.

The sputtering of chromium onto the glass is a vacuum based process which is expensive because of the need for surface preparation of the glass and the need for relatively low vacuum (typically on the order of $10^{-3}$ Torr). Furthermore, the pumping down of a sputtering chamber to obtain the vacuum results in the generation of contaminating particles that can be deposited on the glass surface. These particles interfere with the uniform coating of the chromium on the glass during the sputtering process, and can result in pinhole defects in the chromium layer. As with scratches in a photosensitive emulsion layer, pinholes in the chromium layer can result in the production of a defective integrated circuit, and therefore exhaustive inspection of the photomask blank is required. In addition, since chromium has a relatively high specular reflectivity, i.e., it reflects light well, an anti-reflective layer is often provided between the chromium and the glass plate in order to inhibit unwanted reflections that could degrade the resolution of the light pattern that is transmitted through the mask.

OBJECTS AND BRIEF STATEMENT OF THE INVENTION

Accordingly, it is an object of the present invention to provide a novel photomask for use in the manufacture of integrated circuits as well as a novel process for producing such a photomask. More particularly, it is an object of the invention to provide a novel photomask that exhibits the scratch resistance and durability of a chromium-plated photomask but that is less expensive to produce and provides higher quality optical properties.

Briefly, in accordance with the present invention, the foregoing objects and their attendant advantages are achieved by coating a photomask substrate with a solution of a carbon precursor and treating the thus-coated substrate to form a light-blocking layer of carbon. The carbon layer can be very easily masked and etched in a simple oxygen plasma reactor to provide the desired photomask pattern. Generally, the carbon layer is formed by coating the substrate with a solution of a thermally decomposable organic material and heating the coated substrate in a reducing atmosphere to transform the organic material into carbon.

Among the various advantages offered by the invention are the facts that the carbon film is hard, dense and has about one-half the specular reflectivity of chromium in the range of wavelengths that are typically used in integrated circuit fabrication. In addition, the employment of the coating process and the characteristic pinhole-free films that are produced result in ease of fabrication and lend to a very high degree of automation, to thereby improve the yield at a lower cost.

Further features of the invention are described hereinafter with reference to preferred embodiments thereof and the accompanying illustrations.

BRIEF DESCRIPTION OF THE DRAWINGS

FIG. 1 is a series of perspective views illustrating the sequence of steps in generating a silicon dioxide mask on a wafer;

FIG. 2 is a schematic illustration of the process steps for forming a photomask in accordance with the present invention; and FIG. 3 is a perspective view of a photomask with a detailed enlargement of one portion thereof.

DETAILED DESCRIPTION

In the process of fabricating a photomask, as schematically depicted in FIG. 2, a glass plate 18 is first coated with a thin film 20 of a carbon precursor, that is of carbon or a compound which will decompose to form carbon. The carbon precursor is conveniently applied as a solution in a suitable organic solvent (described in more detail hereinbelow). While many processes for coating the plate with an organic solution are available, the preferred method for coating the plate is by means of a spinning process. Basically, this process involves depositing a small amount of the organic solution in the center of the plate and then spinning the plate to generate centrifugal forces that distribute the solution over the plate in a thin film, similar to the manner in which a photoresist is typically coated on a semiconductor wafer. Thus, the coating of the plate can be automated and carried out in the same type of apparatus as that which is used for an automated photomasking process.

The rotational speed and duration of the spinning process is regulated commensurate with the viscosity of the organic solution so as to produce an adherent film of a desired thickness. Generally speaking, the film must be thick enough so that the resulting carbon layer effectively blocks ultraviolet light. However, if the film is too thick, it may have the tendency to peel off the glass. While the particular thickness can vary in accordance with these guidelines, typical values for a preferred thickness of the film that is spun onto the glass plate are in the range of 1,000–2,000 angstroms.

The organic solution that is coated onto the glass plate must possess certain properties in order to be effective within the context of the present invention. For example, it must adhere well to the glass substrate, i.e., it must wet the substrate, so as to form a continuous film. If the organic solution does not adequately wet the substrate, the film would not be continuous. The film needs to be continuous so that the resulting carbon layer will be continuous and further so that it can be ensured that the only areas of the coated plate which will pass light are those areas in which the carbon is deliberately removed.

Secondly, the solution must be capable of coating the substrate evenly. Typically, this is a function of the solvent in which the material is dispersed as well as the carbon precursor itself. The choice of the appropriate solvent will vary, for example depending on the particular carbon precursor used. While the use of a particular solvent is well within the skill of the art, readily available solvents such as the lower alcohols, e.g. up to 8 carbon atoms (methanol, ethanol, etc.) or ketones (acetone, methylethyl ketone, cyclopentanone) are preferred.

Third, the carbon precursor must be one which provides the desired carbon layer when heated in a reducing atmosphere. The carbon precursor can be carbon itself dissolved in a suitable solvent but preferably is a thermally decomposable organic material in a suitable solvent. Since all organic materials require a certain minimum temperature to break the bonds between the elements and convert the material into carbon, the material which is chosen must be one for which this result can be obtained within practical temperature limits. For example, if quartz glass is used as the substrate, it can be heated to a temperature of in the range of from about 800° to 1200°, preferably about 900° to 1100°, C. to break the bonds in the organic material and thermally decompose it into carbon. It will be appreciated that the organic material which is chosen for use must be capable of being converted into carbon at a temperature below the melting temperature of the substrate.

The thermally decomposable organic material used in the present invention can be any organic material which can be applied to the substrate and which will thermally decompose to form a continuous, pin-hole free carbon layer. For example, phenol or furan resins such as phenol-formaldehyde resins and furfuryl alcohol polymers can be used. In addition, natural organic polymers such as coal pitch and petroleum pitch are useful.

Once the glass substrate is coated with a film of appropriate thickness, it is heated under non-oxidizing conditions, i.e. in a reducing atmosphere, to convert the carbon precursor into carbon layer 22 (FIG. 2b). This heating also serves to drive off the solvent in the organic solution although the material can be dried first, if desired, in air of ambient temperature or under non-oxidizing conditions at ambient or elevated temperatures. As noted above, the appropriate temperature for thermal decomposition will be determined by the melting temperature of the glass substrate and the minimum temperature necessary to provide carbon. Once the heating is completed, a photomask "blank" comprising a glass substrate having a film of pyrolytic carbon on one side thereof results. The thickness of the resulting carbon layer is less than that of the film by an amount related to the percentage of solvents in the solution and the specific nature of the precursor.

In order to provide a suitable photomask for use in the production of integrated circuits, the carbon needs to be patterned, i.e. removed from those areas through which the polymerizing ultraviolet radiation is to pass. This carbon pattern can be provided, for example, by masking the photomask blank with a layer 24 of photoresist material (FIG. 2c). The photoresist layer is then exposed to light through a suitable mask 26 (FIG. 2d) and developed. Etching of the masked carbon layer (FIG. 2e) to provide the desired pattern can then take place in a simple oxygen plasma reactor to selectively remove a portion of the pyrolytic carbon. When the remaining photoresist layer 24 is removed (FIG. 2f), a glass photomask having a patterned layer of carbon results. A more detailed illustration of such a photomask, with one grid thereof being enlarged to show the patterned carbon layer, is illustrated in FIG. 3.

One of the primary advantages offered by the present invention is the fact that the fabrication of a pyrolytic carbon photomask as described above readily lends itself to automation. It is estimated that about 80 percent of the process can be automated. Since such a large portion of the fabrication process is automatable, processing costs are likely to be relatively low, resulting in a reduced cost per mask. In addition, the use of a solution coating process eliminates the need for surface preparation of the glass substrate as is required in the chromium sputtering process that is conventionally employed.

Further, because of the integrity of the film that is coated onto the glass substrate, spot checks of the photomask blank should prove to be adequate, in place of the exhaustive inspection that is required with a chromium-plated photomask. If a hole-type defect is found in the film, the organic solution can be deposited on the film in the defective areas and a laser used to selectively heat the film in those areas, in the presence of a reducing atmosphere, to close up any holes. Alternatively, by using a laser in an oxidizing atmosphere, the pyrolytic carbon can be converted into carbon dioxide to remove unwanted spots.

It should be noted that processes for forming carbon deposits on various substrates, although not on glass to form patterned photomasks, are known in the art and are disclosed, for example, in U.S. Pat. Nos. 3,775,078; 3,854,979; 3,930,822 and 4,210,431. See also "Thin Pinhole-free Carbon Films", Lyons et al, *Thin Solid Films,* 103 (1983) pp. 333-341.

EXAMPLE 1

A patterned photomask is made by first adding 25 g. of a phenol formaldehyde resin in 25 g. of ethanol to 50 g. of cyclopentanone with stirring to form a uniform solution.

A quartz glass plate (127×127 mm square) is placed in a conventional spinning apparatus as is used in automated photowashing. About 25 ml of the resin solution is added to the center of the plate which is spun at 6000 rpm to coat the plate completely and easily with the solution. The solution thickness is about 2500 angstroms and is even across the plate.

The thus-coated plate is placed in a furnace and gradually heated over a 4 hour period to 1000° C. and maintained at that temperature for 30 minutes in an $H_2$ atmosphere. This heating time and temperature is sufficient to drive off the cyclopentanone solvent and to thermally decompose the phenolformaldehyde resin to carbon. The resulting pyrolitic carbon layer is also even and complete across the glass plate with a uniform thickness of about 1200-1500 angstroms. The pyrolytic carbon layer is hard, dense and free of pin holes.

This blank is then masked with a layer of conventional photoresist material ("AZ 1350H") to provide a desired pattern, exposed to light and developed in a conventional manner. The unmasked carbon is then removed in an oxygen plasma reactor. The resulting etched blank is used as a photoresist in a conventional process for the production of integrated circuit chips and is found to perform satisfactorily.

EXAMPLE 2

The procedure of Example 1 is repeated using a solution of furfuryl alcohol in ethanol. A photomask useful in preparing chips for integrated circuits is obtained.

It will be appreciated by those of ordinary skill in the art that the present invention can be embodied in other specific forms without departing from the spirit or essential characteristics thereof. The presently disclosed examples are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method of fabricating a photomask blank for use in the manufacture of integrated circuits which comprises:
    coating a photomask substrate by depositing a solution of a carbon precursor on the surface of the substrate and spinning the substrate to distribute the solution into a uniform film which covers the entire surface of the substrate; and
    heating the thus-coated substrate in a reducing atmosphere to form a light-blocking layer of carbon.
2. The method of claim 1 wherein said solution of a carbon precursor is a solution of a decomposable organic material.
3. The method of claim 1 wherein a photomask is formed by masking selective portions of the carbon-coated substrate and etching the unmasked portions.
4. The method of claim 3 wherein said etching is conducted with an oxygen-based plasma system.
5. The method of claim 2 wherein the decomposable organic material is a hydrocarbon which thermally decomposes to produce carbon at a temperature of from about 800° to 1200° C.
6. The method of claim 5 wherein the decomposable organic material is selected from the group consisting of phenol and furan resins and natural organic polymers.
7. The method of claim 6 wherein the substrate is quartz glass.
8. The method of claim 7 wherein said decomposable organic material is dissolved in a solvent selected from the group consisting of alcohols and ketones.
9. The method of claim 1 and further comprising the step of forming a photomask by removing select portions of the light-blocking layer to thereby provide a patterned carbon layer on said substrate.
10. The method of claim 9 wherein portions of the light-blocking layer are removed by selectively heating the portion of the carbon layer that is to be removed in the presence of an oxidizing atmosphere.
11. The method of claim 10 wherein said selective heating is carried out with a laser.
12. The method of claim 1 further comprising the step of repairing any defects in the carbon layer by selectively heating the layer in the defective areas and in the presence of a reducing atmosphere.
13. The method of claim 12 wherein said selective heating is carried out by directing a laser beam at the defective areas.

* * * * *